United States Patent
Choi et al.

(10) Patent No.: US 9,130,181 B2
(45) Date of Patent: Sep. 8, 2015

(54) ORGANIC LIGHT EMITTING DISPLAY AND METHOD FOR MANUFACTURING THE SAME

(71) Applicant: LG DISPLAY CO., LTD., Seoul (KR)

(72) Inventors: Ho-Won Choi, Daegu (KR); Jae-Do Lee, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/718,391

(22) Filed: Dec. 18, 2012

(65) Prior Publication Data

US 2014/0061597 A1    Mar. 6, 2014

(30) Foreign Application Priority Data

Aug. 31, 2012 (KR) .................. 10-2012-0096740

(51) Int. Cl.
*H01L 51/44* (2006.01)
*H01L 27/32* (2006.01)
*H01L 51/00* (2006.01)
*H01L 51/52* (2006.01)

(52) U.S. Cl.
CPC ............ *H01L 51/447* (2013.01); *H01L 27/323* (2013.01); *H01L 51/0001* (2013.01); *H01L 51/5284* (2013.01)

(58) Field of Classification Search
CPC .......................... H01L 51/447; H01L 51/0001
USPC .................. 257/40, 91, E21.001; 438/29, 23
See application file for complete search history.

(56) References Cited

U.S. PATENT DOCUMENTS

| | | | |
|---|---|---|---|
| 7,068,261 B2 * | 6/2006 | Kubo et al. | 345/173 |
| 2005/0059179 A1 | 3/2005 | Erchak et al. | |
| 2008/0211394 A1 * | 9/2008 | Koshihara et al. | 313/504 |
| 2010/0033443 A1 * | 2/2010 | Hashimoto | 345/173 |
| 2010/0066683 A1 | 3/2010 | Chang et al. | |
| 2010/0110041 A1 | 5/2010 | Jang | |
| 2010/0265206 A1 * | 10/2010 | Chen | 345/174 |
| 2011/0109622 A1 * | 5/2011 | Son et al. | 345/419 |
| 2011/0273397 A1 * | 11/2011 | Hanari | 345/174 |

FOREIGN PATENT DOCUMENTS

| | | |
|---|---|---|
| EP | 1426813 A2 | 6/2004 |
| JP | 2010-243930 A | 10/2010 |

(Continued)

OTHER PUBLICATIONS

Extended European Search Report issued in corresponding European Patent Application No. 12196447.2, mailed Jan. 2, 2014, 10 pages.

(Continued)

*Primary Examiner* — Sheng Zhu
(74) *Attorney, Agent, or Firm* — Brinks Gilson & Lione (57) ABSTRACT

Disclosed are an organic light emitting display that has a configuration excluding a polarizing plate and exhibits improved flexibility and visibility, and a method for manufacturing the same, the organic light emitting display includes a touch electrode array facing the organic light emitting diode on the second buffer layer, the touch electrode array including first and second touch electrodes intersecting each other and an exterior light shielding layer including at least a color filter layer, an adhesive layer formed between the organic light emitting diode and the touch electrode array.

19 Claims, 10 Drawing Sheets

(56) References Cited

FOREIGN PATENT DOCUMENTS

| | | |
|---|---|---|
| KR | 10-2008-0080912 A | 9/2008 |
| KR | 10-2011-0052241 A | 5/2011 |
| TW | 1361496 B | 4/2012 |

OTHER PUBLICATIONS

Office Action issued in Taiwanese Patent Application No. 101149192, mailed Feb. 3, 2015, 24 pages.

Office Action issued in Korean Patent Application No. 10-2012-0096740, mailed Feb. 26, 2015, 4 pages.

* cited by examiner

ORGANIC LIGHT EMITTING DISPLAY AND METHOD FOR MANUFACTURING THE SAME

This application claims the benefit of Korean Patent Application No. 10-2012-0096740, filed on Aug. 31, 2012, which is hereby incorporated by reference as if fully set forth herein.

BACKGROUND

1. Field of the Disclosure

The present disclosure relates to an organic light emitting display, and more particularly, to an organic light emitting display that has a configuration excluding a polarizing plate and exhibits improved flexibility and visibility, and a method for manufacturing the same.

2. Discussion of the Related Art

Examples of flat panel displays include liquid crystal displays (LCDs), organic light emitting displays (OLEDs), plasma display panels (PDPs), quantum dot panels (PDPs), field emission displays (FEDs), electrophoretic displays (EPDs) and the like. These displays include a flat display panel realizing an image in common as an essential component. In such a flat display panel, a pair of transparent insulating substrates are joined together such that they face each other via a layer containing an inherently luminescent or polarizing material or other optical material interposed therebetween.

In accordance with the recent trend toward large-size displays, demand has gradually increased for flat panel displays that occupy a smaller space. Of these flat panel displays, organic light emitting display technologies are being rapidly developed.

Organic light emitting displays do not require any separate light source and include an organic light emitting diode that spontaneously emits light in each pixel, to realize display. The organic light emitting displays attract much attention as next-generation displays since they advantageously do not require light sources as well as structures for assembling the light sources with a display panel, thus having advantages of decrease in thickness and weight.

When electric charges are injected into an organic film formed between an electron injection electrode (cathode) and a hole injection electrode (anode), electrons pair with holes and the pairs then decay. At this time, an organic light emitting diode emits light.

There is an increasing demand for an organic light emitting display of a touchscreen in which a site touched by the hand or separate input element is sensed and information is transferred in response thereto. Such a touchscreen is typically applied by adhesion to the outer surface of the display.

Depending on touch sense method, a touchscreen is divided into resistive, capacitive and infrared sensing types. In consideration of ease of manufacture, sensing force and the like, capacitive type touchscreens attract much attention in small models.

Hereinafter, a touchscreen-integrated organic light emitting display of related art will be described with reference to the annexed drawings.

Figure 1:
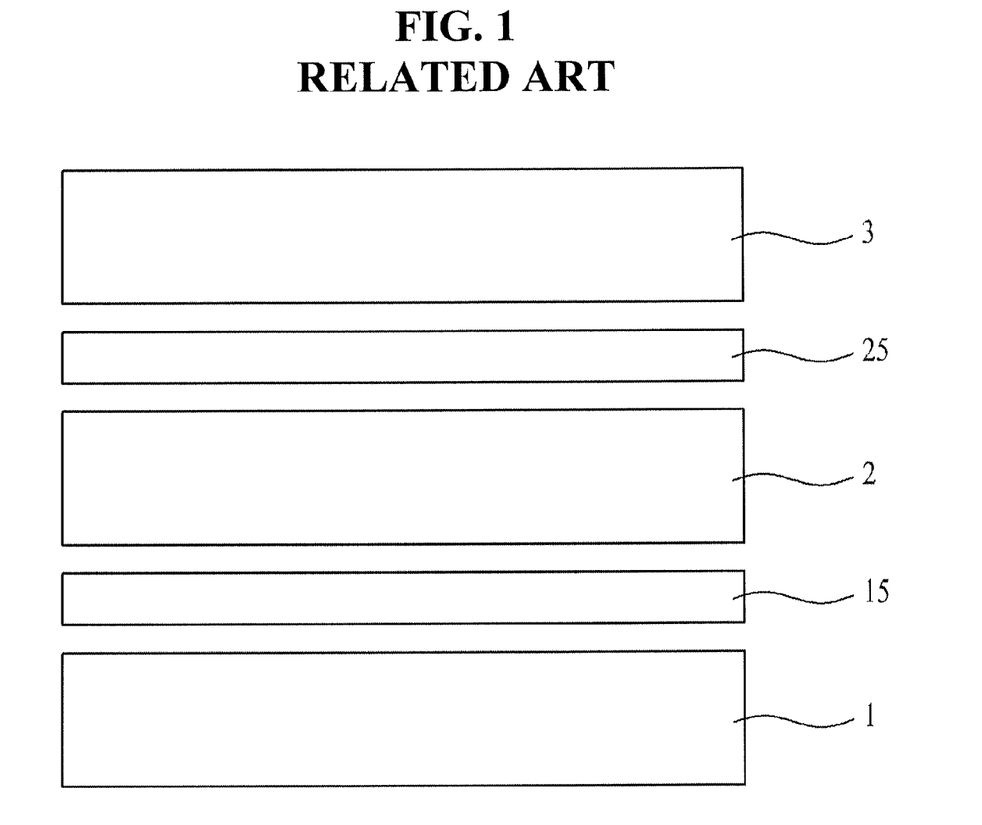
FIG. 1 is a sectional view illustrating a touchscreen-integrated organic light emitting display of related art.

FIG. 1 is a sectional view illustrating a touchscreen-integrated organic light emitting display of related art.

As shown in FIG. 1, the touchscreen-integrated organic light emitting display of related art includes an organic light emitting display panel 1, a touchscreen 2 and a cover window 3 laminated in this order from the bottom and includes first and second adhesive layers 15 and 25 disposed between the respect layers.

Here, the organic light emitting display panel 1 includes a substrate, a thin film transistor array having a matrix form disposed on the substrate, and an organic light emitting diode connected to each thin film transistor of the thin film transistor array, and includes a protective film and a polarizing layer that cover the top of the organic light emitting diode. In this case, the first adhesive layer 15 corresponds to the polarizing layer of the organic light emitting display panel 1. Also, the second adhesive layer 25 is formed between the touchscreen 2 and the cover window 3 to adhere the touchscreen 2 to the cover window 3.

The touchscreen-integrated organic light emitting display has the following disadvantages.

First, in a case in which an organic light emitting display panel and a touchscreen are independently formed and the touchscreen is then attached to the organic light emitting display panel, the organic light emitting display panel and the touchscreen require separate glasses, thus causing increase in hardness and thickness, which makes realization of thin and flexible organic light emitting displays impossible.

Second, the organic light emitting display panel and the touchscreen have different panel shapes, thus making processes for forming these components complicated and thus decreasing yield and price competitiveness.

Third, a polarizing plate is provided in order to prevent recognition of exterior light of the organic light emitting display panel. The polarizing plate has a thickness of about 150 μm or more, is expensive and causes a deterioration in transmittance. Accordingly, since the polarizing plate deteriorates flexibility when used for displays and is expensive, other alternative capable of preventing deterioration in visibility is required.

SUMMARY

An organic light emitting display includes: a first buffer layer and a second buffer layer facing each other; a thin film transistor array including a thin film transistor in each of a plurality of pixels defined in a matrix on the first buffer layer; an organic light emitting diode connected to a thin film transistor of each pixel; a touch electrode array facing the organic light emitting diode on the second buffer layer, the touch electrode array including first and second touch electrodes intersecting each other, and an exterior light shielding layer including at least a color filter layer; an adhesive layer between the organic light emitting diode and the touch electrode array; a cover glass on a rear surface of the second buffer layer; and a film substrate on a rear surface of the first buffer layer.

In accordance with another aspect of the present invention, provided is a method for fabricating an organic light emitting display including: forming a first etch stopper film and a first buffer layer on a first substrate, and forming a thin film transistor array including a thin film transistor in each of a plurality of pixels defined in a matrix form and an organic light emitting diode connected to a thin film transistor of each pixel in an active region of the first buffer layer; forming a second etch stopper film and a second buffer layer on a second substrate; forming a touch electrode array facing the organic light emitting diode on the second buffer layer, wherein the touch electrode array includes first and second touch electrodes intersecting each other, and an exterior light shielding layer including at least a color filter layer; joining the first and second substrates via an adhesive layer between the organic light emitting diode and the touch electrode array; removing the first substrate and the second substrate; and adhering a film substrate to the exposed first etch stopper film and covering the exposed second etch stopper film with a cover glass.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and simultaneously with the description serve to explain the principle of the invention. In the drawings.

DETAILED DESCRIPTION OF THE EXEMPLARY EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Hereinafter, an organic light emitting display and a method for manufacturing the same will be described in detail with reference to the annexed drawings.

In recent years, there has been an increasing demand for touch sensing as well as thinness and flexibleness of organic light emitting displays. In response to this, a method in which a thin film transistor and an organic light emitting array are formed on a first substrate, a touch electrode array is formed on a second substrate, these substrates are joined together, and the hard and thick first and second substrates are removed by laser irradiation or etching in order to realize thin film and flexibility is suggested. In this case, a pad portion of the touch electrode array faces a pad portion of the organic light emitting array, and these pad portions are connected to each other via a conductive ball, thus enabling transfer of signals to the touch electrode array and detection of signals from the touch electrode array.

Hereinafter, an in-cell organic light emitting display in which a touch electrode array is provided inside a cover glass will be described.

Figure 2:
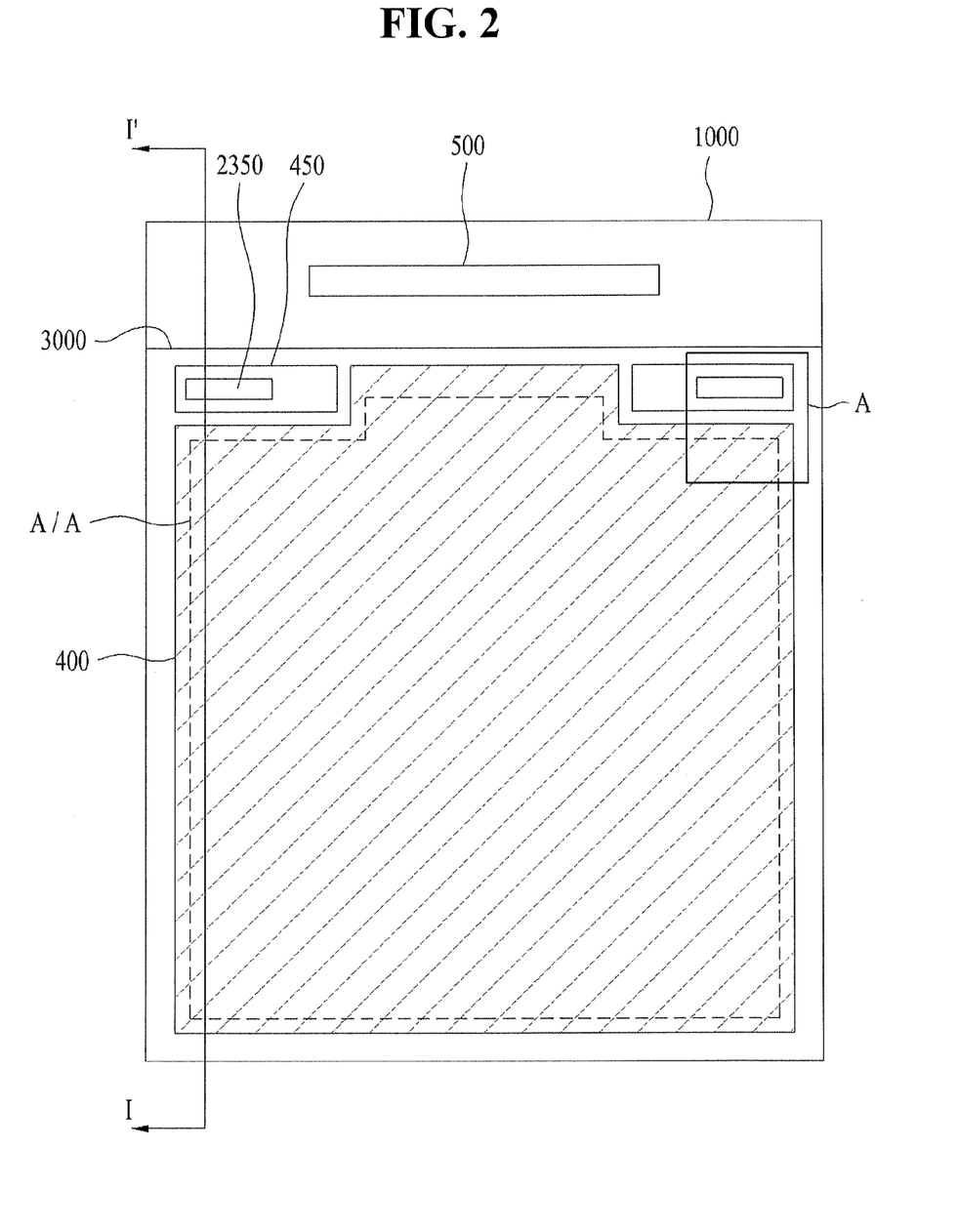
FIG. 2 is a plan view illustrating an organic light emitting display according to an embodiment of the present invention.
Figure 3:
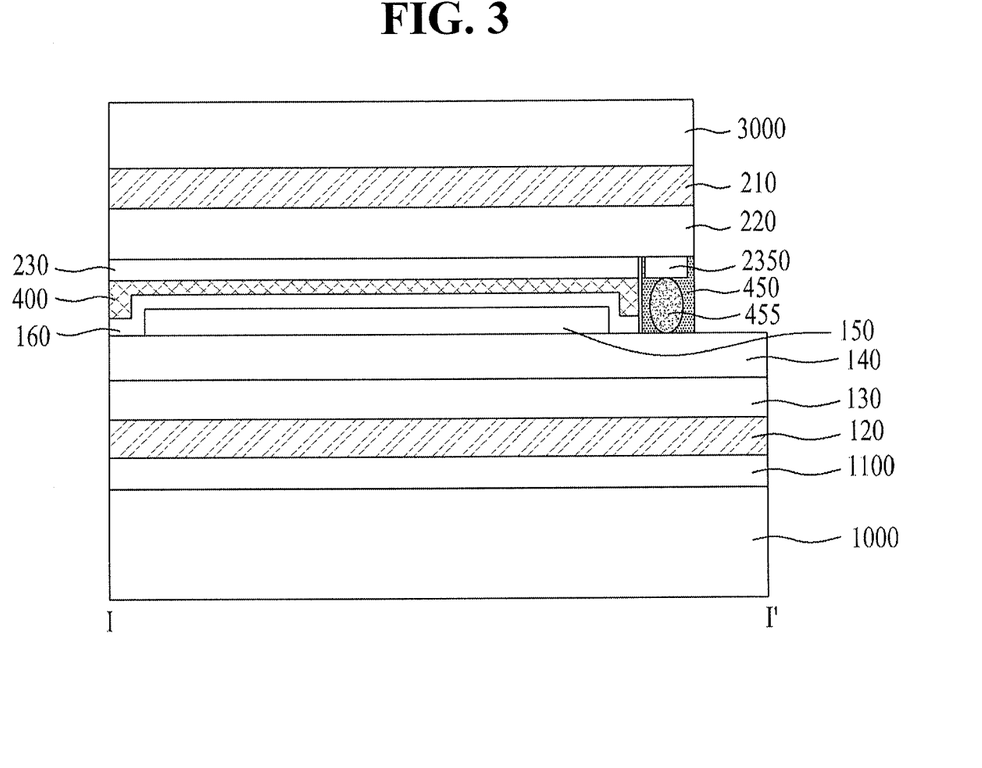
FIG. 3 is a sectional view taken along the line I-I' of FIG. 2.

FIG. 2 is a plan view illustrating an organic light emitting display according to the present invention. FIG. 3 is a sectional view taken along the line I-I' of FIG. 2.

As shown in FIG. 2 and FIG. 3, the organic light emitting display according to the present invention has a configuration in which an organic light emitting array 150 and a touch electrode array 230, that are formed at an inside of a film substrate 1000 and at an inside of a cover glass 3000, respectively, and have different sizes, are joined to each other via an adhesive layer 400.

Also, the organic light emitting display according to the present invention excludes a polarizing plate under a cover glass, and further includes an exterior light shielding layer 2400 including a black matrix layer (represented by "242" in FIG. 5) and a color filter layer (represented by "241" in FIG. 5) in the touch electrode array that performs a function of preventing recognition of exterior light, instead of the polarizing plate. The black matrix layer and the color filter layer prevent emission of incident light in order to prevent exterior light incident upon the organic light emitting display from being reflected and be seen by a viewer. A detailed description of the touch electrode array having this configuration will be provided with reference to FIG. 5.

These arrays are not directly formed on the film substrate 1000 or the cover glass 3000 and are obtained by separately preparing first and second substrates (both, not shown), each being made of glass, joining the substrates via an adhesive layer disposed between the organic light emitting array 150 and the touch electrode array 230 (that is, this joining process is performed while keeping the first and second substrates), and removing the first and second substrates by laser irradiation or etching for realization of thin film and flexibility. In this case, as shown in FIG. 2, the first and second substrates formed of glass materials are removed and the film substrate 1000 and the cover glass 3000 are adhered to the bottom of the exposed arrays, respectively, in order to protect these arrays.

A film adhesive layer 1100, a first etch stopper layer 120, a first buffer layer 130 and a thin film transistor array 140 and an organic light emitting array 150 are formed on the film substrate 1000 in this order and a protective layer 160 is formed to cover the organic light emitting array 150. A second etch stopper layer 210, a second buffer layer 220 and a touch electrode array 230 are disposed on the cover glass 3000. The touch electrode array 230 is disposed to face the organic light emitting array 150. In this case, the protective layer 160 directly contacts the bottom of the adhesive layer 400 and the touch electrode array 230 directly contacts the top thereof.

An active region and a dead region are defined in the first buffer layer 130 and the second buffer layer 220, respectively, and the touch electrode array 230, the organic light emitting array 150 and thin film transistors present in the thin film transistor array 140 excluding a pad portion are formed in the active region. Also, the touch electrode pad portion 2350 and the pad portion of the thin film transistor array are defined in part regions of the dead region.

The first etch stopper layer 120 and the second etch stopper layer 210 function to prevent damage to an internal array, in addition to the glass materials of first and second substrates during laser irradiation or etching. If desired, the first and second buffer layers 130 and 220 disposed thereunder are not damaged during removal of the first and second substrates, the first and/or second etch stopper layers 120 and 210 may be omitted.

Also, the first buffer layer 130 and the second buffer layer 220 may be formed by sequentially laminating the same type of inorganic film such as an oxide film ($SiO_2$) or nitride film (SiNx), or alternatively laminating different types of inorganic films. The first and second buffer layers 130 and 220 serve as barriers that prevent permeation of moisture or exterior air into the organic light emitting array 150 after the second substrate is joined to the first substrate.

Also, both the touch pad portion 2350 and the touch electrode array 230 are formed on the same surface of the second buffer layer 220.

The touch pad portion 2350 is connected to the pad portion of the thin film transistor array 140 via a sealant 450 including a conductive ball 455, when the upper and lower substrates are joined to each other via the adhesive layer 400. The adhesive layer 400 functions to prevent permeation of moisture and directly contacts the protective layer 160 that covers the organic light emitting array 150, thus preventing permeation of exterior air into the organic light emitting array 150 and more certainly prevents permeation of moisture, in addition to the functions of the protective layer 160.

The thin film transistor array 140 including the pad portion has a side that protrudes from the touch electrode array 230. This configuration aims at providing, at the protrusion, an IC 500 that transfers a signal to simultaneously drive the touch electrode array and the thin film transistor array, and the organic light emitting array. Although not shown, the IC 500 is connected through lines (not shown) formed on the IC 500 and the first buffer layer 130 to driving pads and dummy pads of the thin film transistor array. Also, the IC 500 is bonded and connected to a flexible printed circuit board (FPCB, not shown) and may be controlled by a controller (not shown) provided in the FPCB. The dummy pad is formed in the same layer as a metal constituting a gate or data line in a region corresponding to the touch pad portion among the dead region disposed out of the active region.

The touch pad portion 2350 is formed on the second buffer layer 220 and is formed at both edges of the side adjacent to a portion where the first buffer layer 130 protrudes more than the second buffer layer 220. Also, the touch pad portion 2350 formed at one edge is divided into a plurality of pad electrodes to enable voltage application or detection of first electrodes arrayed in an X-axis direction in the touch electrode array, and the touch pad portion 2350 formed at the other edge is divided into a plurality of pad electrodes to enable voltage application or detection of second electrodes arrayed in an Y-axis direction.

The conductive ball 455 connected to the touch pad portion 2350 is electrically connected to a dummy electrode (not shown) formed out of the thin film transistor array 140.

During an actual process, the adhesive layer 160 and the sealant 450 are separately formed by application to different regions.

Meanwhile, as shown in FIG. 3, the organic light emitting display according to the present invention includes a film substrate 1000, a first etch stopper film 120 and a first buffer layer 130 formed in this order on the film substrate 1000, a thin film transistor array 140 having a thin film transistor in each pixel defined in a matrix form on the first buffer layer 130, an organic light emitting array 150 connected to the thin film transistor of each pixel, a protective layer 160 that covers the thin film transistor array 140 excluding the pad portion and the organic light emitting array 150, a touch electrode array 230 adhered to the protective layer via an adhesive layer 400 interposed between the protective layer 160 and the touch electrode array 230, and a second buffer layer 220 and a second etch stopper film 210 formed in this order on the touch electrode array 230, and includes a cover glass 3000 disposed on the second etch stopper film 210.

The cover glass 3000 may be adhered to the second etch stopper film 210 via an adhesive layer interposed between the second etch stopper film 210 and the cover glass 3000, or may be disposed on the second etch stopper film 210 by a mechanical method or another method. The cover glass 3000 prevents damage to internal array from direct touch of a user and protects the internal array therefrom.

The organic light emitting display according to the present invention can be reduced in thickness by omitting a glass substrate having a thickness of about 0.7 mm, which is the thickest of components in the display, and can realize a bendable or flexible display using the film substrate 1000 as a plastic insulating film that functions to support the thin film transistor array 140, the organic light emitting array 150 and the touch electrode array 230.

In addition, in the process of forming arrays such as the thin film transistor array 140, the organic light emitting array 150 and the touch electrode array 230 on the film substrate, the film substrate is thermally expanded by heat applied to apparatuses for depositing or patterning the arrays, thus making normal processing impossible. In order to prevent this phenomenon, substantially, formation of arrays is carried out by forming etch stopper films 120 and 210 and buffer layers 130 and 220 under the thin film transistor array 140 and the touch electrode array 230, respectively, on the glass substrate, before formation of the thin film transistor array 140 and formation of the touch electrode array 230, and then loading the glass substrate in an apparatus for deposition or patterning.

Meanwhile, the thin film transistor array 140 includes a plurality of gate lines and a plurality of data lines that intersect each other to define pixels, and thin film transistors formed at the respective intersections between the gate lines and the data lines. A pad portion of the thin film transistor array 140 is obtained by forming a pad portion metal in the process of forming the gate and data lines.

Also, the organic light emitting array 150 includes a first electrode formed at least in the pixel, a second electrode formed in an upper layer spaced from the first electrode, and an organic light emitting layer formed between the first and second electrodes. The first electrode may be connected to a drain electrode of the thin film transistor.

In addition, the first etch stopper film 120 and the second etch stopper film 210 may be for example formed of polyimide or photo-acryl.

The first and second etch stopper films 120 and 210 have a thickness of about 1 μm to about 20 μm.

Also, the first buffer layer 130 and the second buffer layer 220 function to prevent permeation of oxygen or moisture into organic films provided in the organic light emitting array and serve as barriers that prevent permeation of exterior air or moisture injected from a lower part.

The first buffer layer 130 and the second buffer layer 220 include a plurality of inorganic films. For example, the inorganic films may be formed by continuously or alternatively laminating $SiN_x$ or $SiO_2$. It can be seen from experimentation that, when two or more layers are laminated to a thickness of about 5,000 Å to 6,500 Å as the first and second buffer layers 130 and 220, permeation of exterior air or moisture can be prevented. A total thickness of the first and second buffer layers 130 and 220 is 1 μm or less, which does not increase the thickness of the touchscreen-integrated display device.

Hereinafter, a configuration of the touch electrode array according to the present invention will be described in detail.

Figure 4:
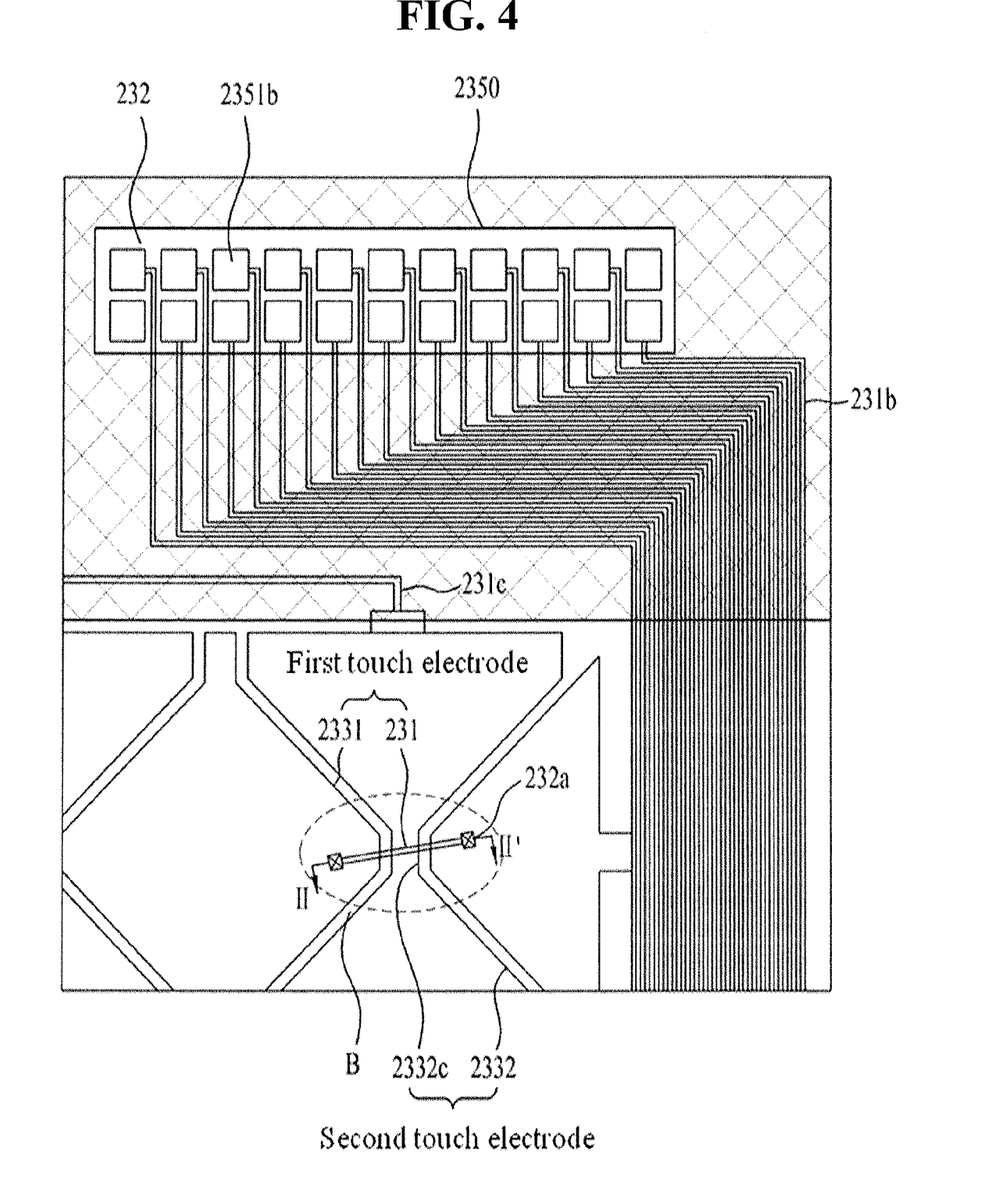
FIG. 4 is an enlarged plan view of a region "A" of FIG. 2.
Figure 5:
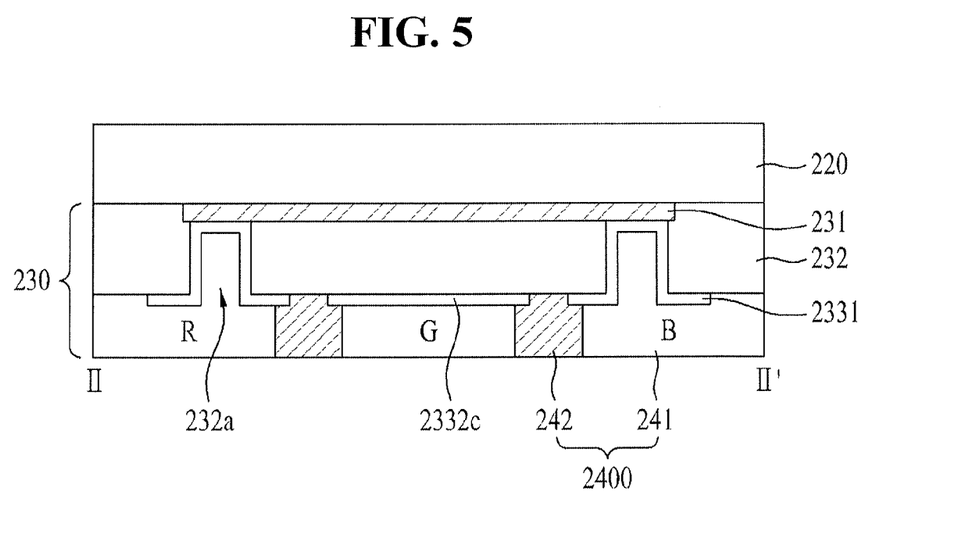
FIG. 5 is a sectional view taken along the line II-II' of FIG. 4 according to a first embodiment of the present invention.

FIG. 4 is an enlarged plan view of a part "A" of FIG. 2. FIG. 5 is a sectional view taken along the line II-II' of FIG. 4 according to a first embodiment of the present invention.

As shown in FIGS. 4 and 5, the touch electrode array 230 according to the first embodiment of the present invention includes a first touch electrode and a second touch electrode intersecting each other, and a touch pad 2351b (provided in a touch pad portion 2350) transferring a signal to the first and second touch electrodes. The touch pad 2351b may be connected to a dummy pad (not shown) formed in the dead region of the thin film transistor array. FIG. 3 illustrates a thin film transistor array 140 including the dummy pad, and a touch electrode layer as one layer including the touch pad, and first and second touch electrodes 2331 and 2332. These layers are patterned according to individual electrodes.

The first touch electrode is disposed in a first direction and includes a first electrode pattern 2331 disposed in an island form and a metal bridge 231 to electrically connect the first electrode pattern 2331 to another first electrode pattern 2331 adjacent to a layer different from the first electrode pattern, and the second touch electrode is disposed in a direction intersecting the first direction and includes a second electrode pattern 2332 having the same shape as the first electrode pattern 2331 and a connection pattern 2332c to connect adjacent second electrode patterns 2332 in an integrated form with the second electrode pattern.

The first electrode pattern 2331, the second electrode pattern 2332 and the connection pattern 2332c are formed as the same transparent electrode in a first layer, the metal bridge 231 is formed in a second layer on a first interlayer insulating film 232 interposed between the first layer and the second layer, and the first interlayer insulating film may include a contact hole 232a in a region where the metal bridge 231 overlaps the second electrode patterns 2332.

In the drawing of FIG. 5, the first layer corresponds to the surface of the first interlayer insulating film 232 and the second layer corresponds to the second buffer layer 220. This shows an example in which the metal bridge 231 is formed on the second buffer layer 220, a first interlayer insulating film 232 including a contact hole 232a is then formed, the first electrode pattern 2331, and the second electrode pattern 2332 and the connection pattern 2332c are then formed, although the present invention is not necessarily limited thereto. If desired, formation order of the metal bridge 231 and the first and second electrode patterns 2331 and 2332 and connection pattern 2332c may be changed.

Also, an exterior light shielding layer 2400 including a black matrix layer 242 and a color filter layer 241 is formed on the first interlayer insulating film 232 including the first and second electrode patterns 2331 and 2332 and the connection pattern 2332c.

The black matrix layer 242 absorbs light and blocks transmission of light, and is formed on the edge of respective pixels of the thin film transistor array and the organic light emitting diode that face the touch electrode array 230.

Also, a red pigment layer (R), a green pigment layer (G) and a blue pigment layer (B) constituting the color filter layer 241 correspond to pigment layers that transmit light having the same color as light emitted from the light emitting layer of the organic light emitting diode in respective pixels. For example, in a pixel in which the light emitting layer of the organic light emitting diode is a red light emitting layer, the red pigment layer (R) corresponds to the red light emitting layer, in a pixel in which the light emitting layer is a green light emitting layer, the green pigment layer (G) corresponds to the green light emitting layer, and in a pixel in which the light emitting layer is a blue light emitting layer, the blue pigment layer (B) corresponds to the blue light emitting layer.

Meanwhile, as shown in FIG. 4, the first interlayer insulating film 232 is exposed on a neighboring portion of touch pads 2351b in the touch pad portion 2350. This means that the neighboring portion has a step lower than the touch pad 2351b including electrodes, transparent electrodes and the like which are laminated. This step makes the level of the touch pad 2351b higher, makes the conductive ball 455 compressed during bonding and thereby facilitates contact between the touch pad 2351b and the conductive ball 455.

Figure 6:
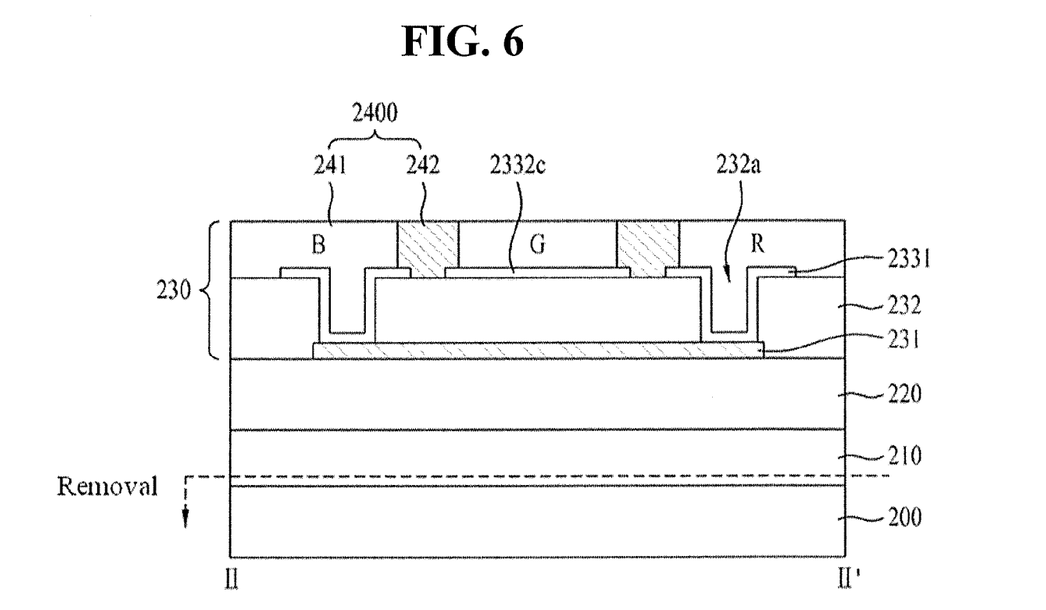
FIG. 6 is a view illustrating a process of forming a touch electrode array of an organic light emitting display according to the present invention.

FIG. 6 is a view illustrating a process of forming a touch electrode array of an organic light emitting display according to the present invention.

As shown in FIG. 6, formation of the touch electrode array 230 of the organic light emitting display is carried out on a second buffer layer 220 after sequentially forming a second etch stopper film 210 and the second buffer layer 220 on a second substrate 200.

As described above, the second buffer layer 220 is a laminate having a thickness of 1 μm including a plurality of inorganic films. In order to prevent damage from heat, etching solution or the like applied during formation of the array, an array formation process is not directly performed on the second buffer layer 220 and an array formation process is performed on the second substrate 200 made of a glass component.

After the touch electrode array 230 is joined to the organic light emitting array 150 such that these arrays face each other, the first substrate (not shown) and the second substrate 200 made of glass components are removed by etching using an etching solution or through laser irradiation. At this time, the second etch stopper film 210 prevents damage to the first and second buffer layers 130 and 220 and arrays disposed thereon. As described above, the first and second etch stopper films 120 and 210 may be organic film components resistant to etching solution or laser irradiation. However, the first and second etch stopper films 120 and 210 have a thickness of 20 μm or less and thus neither increase the thickness of the device nor deteriorate flexibility.

Meanwhile, the exterior light shielding layer 2400 including the black matrix layer 242 and the color filter layer 241 may have other shapes.

Hereinafter, another embodiment of the touch electrode array including another form of exterior light shielding layer will be described.

FIGS. 7A to 7E illustrate a touch electrode array according to an organic light emitting display according to another embodiment.

Figure 7A:
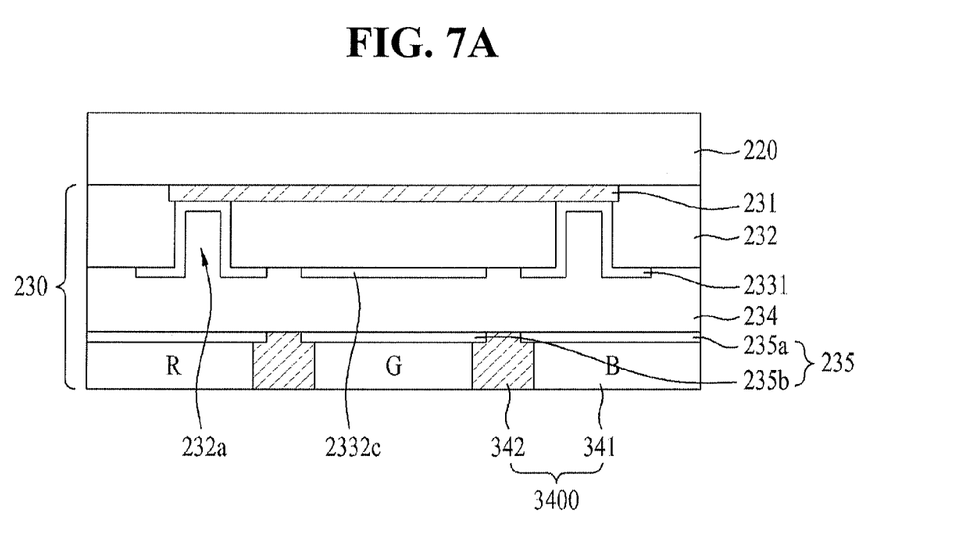
FIGS. 7A to 7E illustrate a touch electrode array according to an organic light emitting display according to another embodiment.

FIG. 7A illustrates a touch electrode array of an organic light emitting display according to the second embodiment of the present invention. Comparing the second embodiment with the first embodiment, the second embodiment further comprises common transparent electrode patterns 235a and 235b that cover the second interlayer insulating film 234 and the first electrode pattern 2331, the second electrode pattern 2332 and the connection pattern 2332c on the first interlayer insulating film 232 including the first electrode pattern 2331, the second electrode pattern 2332 and the connection pattern 2332c.

The first electrode pattern 2331 is covered with the first common transparent electrode pattern 235a and the second electrode pattern 2332 and the connection pattern 2332c which are integrated with each other are covered with the second common transparent electrode pattern 235b.

Also, the exterior light shielding layer 3400 including the black matrix layer 342 and the color filter layer 341 is formed on the second interlayer insulating film 234 including the common transparent electrode pattern 235a.

As shown in FIG. 2, the common transparent electrode pattern 235a blocks effects of a signal transferred from the organic light emitting array 150 or the thin film transistor array 140 disposed in a lower part on driving of the touch electrode array 230, when the touch electrode array 230 contacts the protective film 160 covering the organic light emitting array 150 via an adhesive layer 400. The common transparent electrode pattern 235a has a floating state, which stabilizes driving of the first touch electrode and the second touch electrode disposed therein without application of exterior voltage.

Figure 7B:
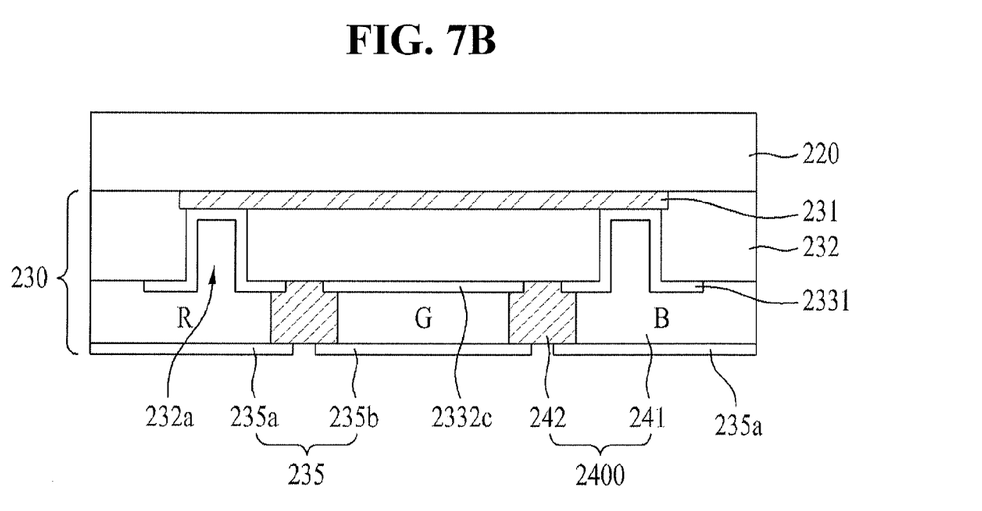

FIG. 7B illustrates a touch electrode array of an organic light emitting display according to a third embodiment of the present invention. In comparison with the second embodiment, the third embodiment includes a shielding layer 2400 including the black matrix layer 242 and the color filter layer 241, instead of the second interlayer insulating film 234. In this case, the second interlayer insulating film 234 may be omitted, and the process of the first embodiment is simplified, as compared to the second embodiment.

Figure 7C:
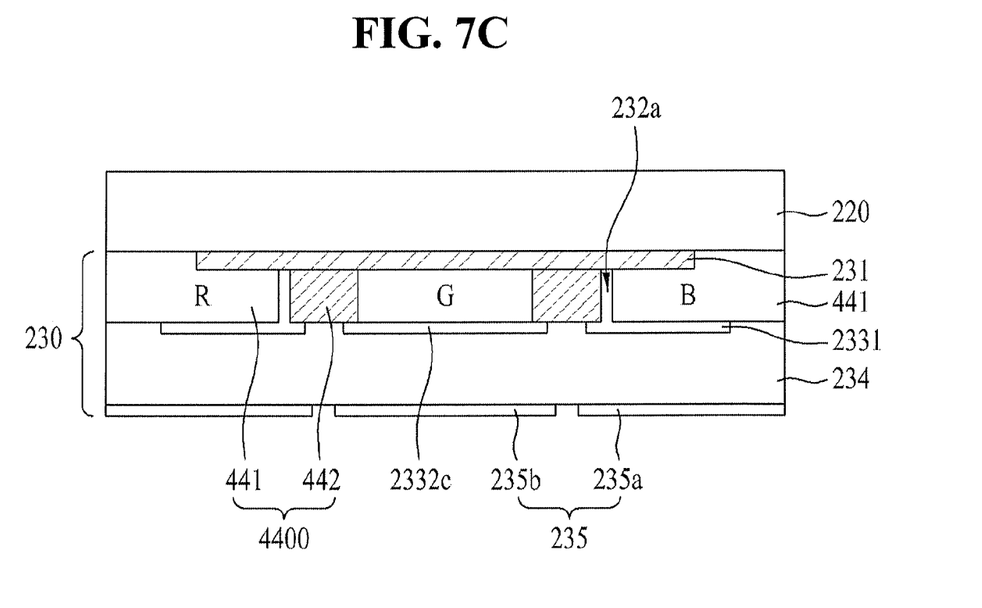

FIG. 7C illustrates a touch electrode array of an organic light emitting display according to a fourth embodiment of the present invention. In comparison with the second embodiment, the third embodiment includes a shielding layer 2400 including the black matrix layer 442 and the color filter layer 441, instead of the first interlayer insulating film 232. In this case, the first interlayer insulating film 232 may be omitted, and the process of the first embodiment can be simplified, as compared to the second embodiment.

Figure 7D:
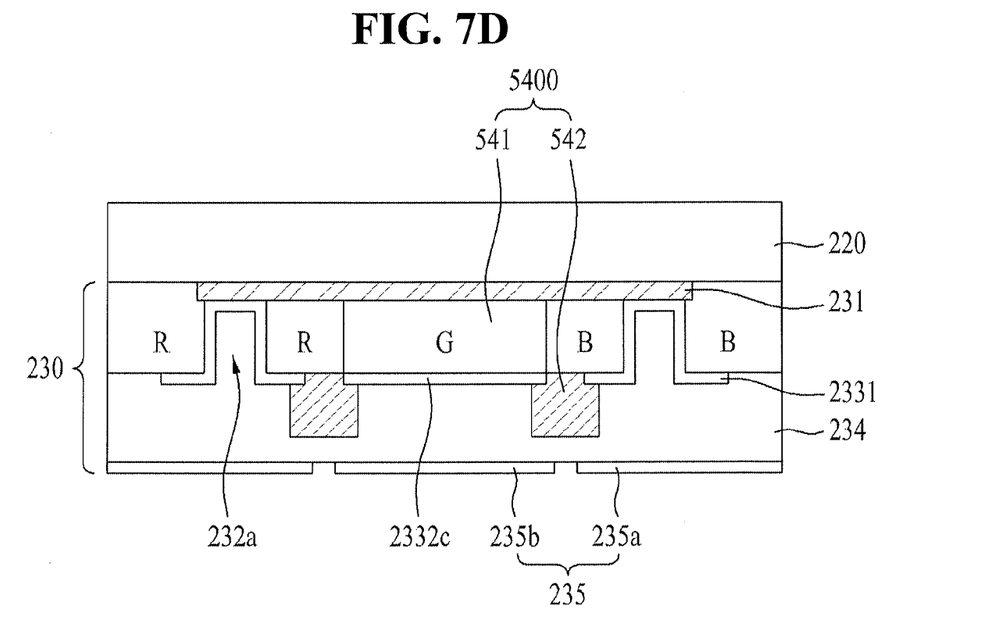

FIG. 7D illustrates a touch electrode array of an organic light emitting display according to a fifth embodiment of the present invention. In comparison with the second embodiment, the fifth embodiment includes a color filter layer 541 including a red pigment (R), a green pigment (G) and a blue pigment (B), instead of the first interlayer insulating film 232.

In the fifth embodiment, a contact hole 232a is formed in the color filter layer 541, the first electrode pattern 2331 connected to the metal bridge 231 through the contact hole 232a, the second electrode pattern 2332 which is spaced from the first electrode pattern 2331 and is disposed in a direction intersecting the disposition direction of the first electrode pattern 2331, and a connection pattern 2332c integrated therewith are formed on the color filter layer 541. Also, at the edge of a pixel where the organic light emitting array faces the thin film transistor array during joining, the black matrix layer 542 is formed on transparent electrode layers of the first electrode pattern 2331, the second electrode pattern 2332 and the connection pattern 2332c including the color filter layer 541. In the fifth embodiment, as compared to the second embodiment, the first interlayer insulating film may be omitted.

Also, the black matrix layer 542 and the color filter layer 541 formed in different layers serve as exterior light shielding layer 5400.

Figure 7E:
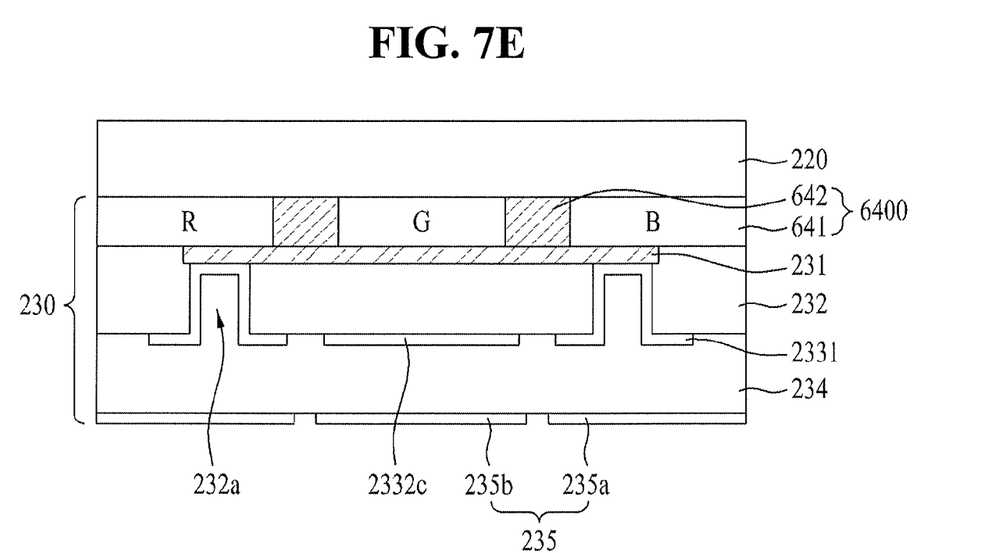

FIG. 7E illustrates a touch electrode array of an organic light emitting display according to a sixth embodiment of the present invention. Compared with the second embodiment, the sixth embodiment comprises an exterior light shielding layer 6400 including a black matrix layer 642 and a color filter layer 641 under the metal bridge 231.

Meanwhile, according to the organic light emitting display of the present invention, the reason for forming the exterior light shielding layer using the black matrix layer and the color filter layer during formation of the touch electrode array is as follows.

Through the array formation process, the black matrix layer is formed to have a small thickness of 1 µm to 3 µm and is readily formed in a predetermined region through a printing process only, without using any mask. Accordingly, the black matrix layer is easily formed, absorbs certain colors of light according to individual wavelength bands and thus prevents reflection and recognition of exterior light incident upon the organic light emitting display by the electrode of the organic light emitting diode. Also, a combination of a circular or linear polarizing plate and a phase-retarder layer which is required for organic light emitting displays and has a large thickness can be omitted and flexibility and thinness of organic light emitting displays can thus be easily realized. Generally polarizing plates have a thickness of about 150 µm or more. This thickness can be reduced and great effects of improvement in transmittance and reduction in thickness can thus be obtained.

Also, in a case in which the circular polarizing plate or the like is provided, an organic film requiring light-isotropy is used as the etch stopper layer in order to compensate a viewing angle. The present invention does not require this organic film, thus enabling use of a general organic film incapable of performing optical compensation. Accordingly, an expensive optical film can be omitted and costs can thus be reduced.

Also, the black matrix layer and the color filter layer used for the exterior light shielding layer can alternate interlayer insulating films, thus enabling formation of a touch electrode array without increase in thickness and addition of separate processes.

Figure 8:
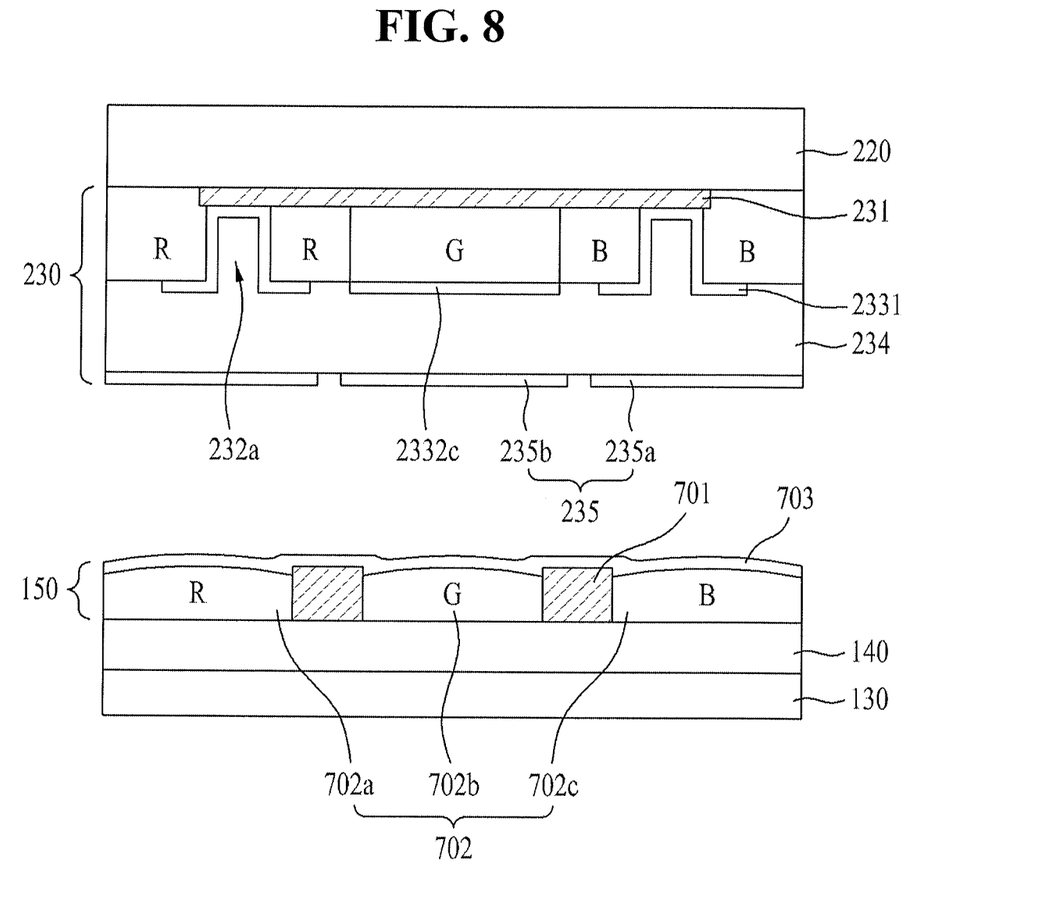
FIG. 8 is a sectional view illustrating an organic light emitting display according to a modified embodiment of the present invention.

Meanwhile, the afore-mentioned embodiment as well as a modified embodiment as shown in FIG. 8 may be used.

FIG. 8 is a sectional view illustrating an organic light emitting display according to a modified embodiment of the present invention.

In comparison with the fifth embodiment, in the modified embodiment shown in FIG. 8, the black matrix layer 701 is formed, instead of a bank to isolate respective pixels, on the organic light emitting array 150 formed on the first buffer layer 130 and thin film transistor array 140 which face the black matrix layer 701.

In this case, the black matrix layer is not further provided in order to prevent recognition of exterior light and the black matrix layer 701 is disposed instead of the bank, thus having an advantage of process simplification.

In this case, in order to prevent recognition of exterior light, the black matrix layer 701 is formed on the thin film transistor array 140 and the color filter layer 541 is formed in the touch electrode array 230.

Non-described reference numeral "703" represents a second electrode of the organic light emitting array 150 and 702 (702a, 702b and 702c) represents a light emitting layer provided in each pixel.

In this case, the remaining first electrode of the organic light emitting diode may be formed on the thin film transistor array 140.

Figure 9:
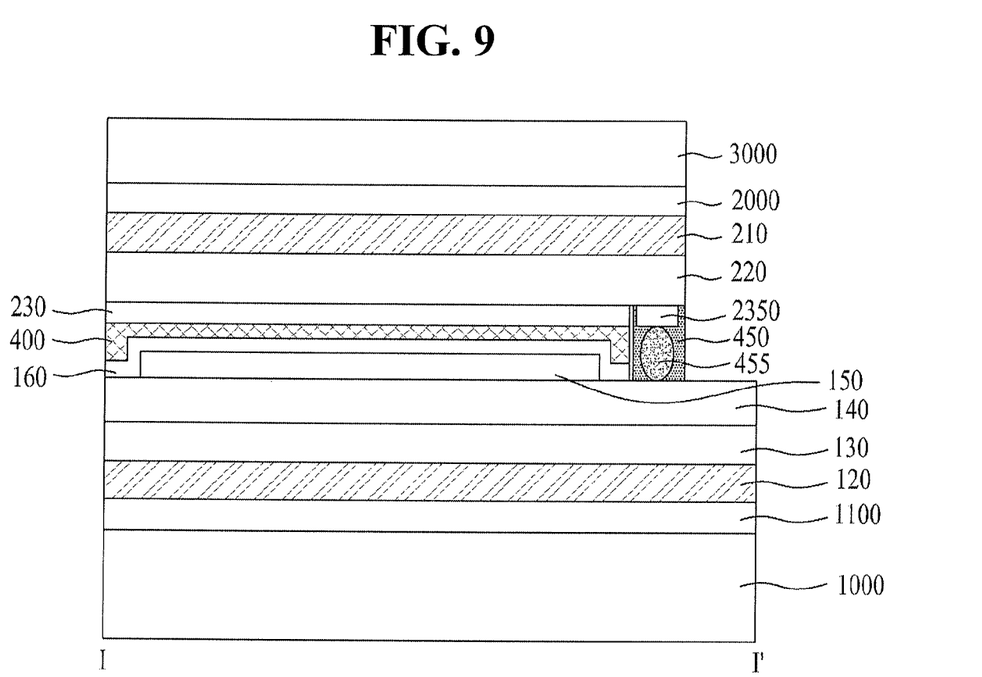
FIG. 9 is a reference embodiment of the present invention compared with the organic light emitting display in terms of visibility.

FIG. 9 is a reference embodiment of the present invention compared with the organic light emitting display in terms of visibility.

In comparison with the embodiment shown in FIG. 3, the reference embodiment of FIG. 9 further includes a polarizing plate 2000 inside the cover glass 3000 and excludes an exterior light shielding layer in the touch electrode array 230. The remaining components having the same reference numeral as in FIG. 3 have the same configurations and a detailed description thereof will be omitted.

Reflectivity and transmittance values obtained by simulating the configurations shown in FIGS. 3 and 9, actual transmittance under conditions of exterior light at 320,000 cd and transmittance of organic light emitting diode of 500 nit are shown in Table 1 below.

TABLE 1

|  |  | Reference embodiment | Present invention |
|---|---|---|---|
| Simulation | Reflectivity | 0% | 3.3% |
|  | Transmittance | 40% | 90% |
| Actually measured | Reflectivity (under 320,000 cd) | Measured data: 20777 cd 6.5% | Measured data: 26755 cd 8.4% |
|  | Transmittance (under 500 nit) | Measured data: 190 nit 38% | Measured data: 440 nit 88% |

As can be seen from Table 1 above, in this simulation, when an aperture ratio is 10%, in the reference embodiment, reflectivity and transmittance are determined as 0% and 40%, respectively, regardless of aperture ratio, depending on polarizing plate properties. Also, reflectivity of the present invention is determined by reflectivity of a region corresponding to the color filter layer, which corresponds to about 3.3% obtained by the equation of 10%*⅓. Also, in the simulation of the present invention, transmittance is about 90% when the color filter layer corresponds to the light emitting layer having the same color.

The values obtained by the simulation are ideal values which are slightly different from measured values.

That is, under exterior light of 320,000 cd, reference embodiment reflects light of 20,777 cd which is 6.5% greater than the simulation value, 0%, and the present invention reflects light of 26,755 cd, which corresponds to 8.4% which is slightly larger than a simulated value, 3.3%. This difference in values is caused by reflection to other layers, in addition to the touch electrode array. These values are 10% or less, such that a viewer does not see exterior light. From the actually measured values of the reference embodiment and the present invention, recognition of exterior light is prevented.

Also, actually measured transmittance of the reference embodiment and the present invention is obtained by testing at an organic light emitting diode brightness of 500 nit. That is, when brightness of the organic light emitting diode disposed under the touch electrode array is 500 nit, the reference embodiment has a measured value of 190 nit and has a transmittance efficiency of about 38% due to presence of the polarizing plate having a strong light-absorbing property, while the present invention has a measured data of 440 nit and has a transmittance efficiency of 88% due to use of the color filter layer having superior transmittance.

That is, as can be seen from the simulation and actual measurement, the present invention and the reference embodiment have similar reflectivity, but the present invention has considerably higher transmittance.

Hereinafter, a method for fabricating an organic light emitting display according to the present invention will be described with reference to FIGS. 2 to 6.

First, a first etch stopper film 120, a first buffer layer 130, a thin film transistor array 140 including a thin film transistor formed in each of a plurality of pixels defined in a matrix form in an active region of the first buffer layer 130, and an organic light emitting array 150 including an organic light emitting diode connected to the thin film transistor of each pixel are formed on a first substrate (not shown).

Also, a protective film 160 is formed such that it covers the organic light emitting array 150. This protective film 160 may be omitted, if desired.

Also, a second etch stopper film 210 and a second buffer layer 220 are formed on the second substrate 200.

Then, first and second touch electrodes intersecting each other, and a touch electrode array 230 including a black matrix layer 242 and a color filter layer 241 are formed on the second buffer layer 220. During formation of the touch electrode array 230, a touch pad portion 2350 including a plurality of touch pads 2351b is formed in a part of the dead region. A detailed description and various embodiments associated with formation of the touch electrode array 230 can be seen from FIGS. 5, 7a to 7e and 8.

Then, an adhesive layer 400 is interposed between the protective film 160 that covers the organic light emitting array 150 and the touch electrode array 230 and a joining process is performed. In this process, a sealant 450 including a conductive ball 455 is applied to the touch pad portion 2350 and the conductive ball 455 bonds the touch pad portion 2350 disposed on the second buffer layer 220 to a dummy pad of the thin film transistor array 140 disposed on the first buffer layer 130.

Then, the first substrate and the second substrate 200 are removed via laser irradiation or using an etching solution.

Then, a film substrate 1000 is adhered to the exposed first etch stopper film 120 via an adhesive layer 110 and the exposed second etch stopper film 210 is covered with a cover glass 3000. Here, an adhesive layer may also be interposed between the second etch stopper film 210 and the cover glass 3000.

For realization of flexibility and thinness of displays, as recent trends, the organic light emitting display of the present invention is characterized in that a layer having the same function of preventing recognition of exterior light as the polarizing plate is formed during the touch electrode array formation process, instead of the polarizing plate. As a result, realization of ultra-slim organic light emitting displays is possible.

The organic light emitting display and the method for fabricating the same according to the present invention have the following effects.

First, the black matrix layer is readily formed to have a small thickness of 1 μm to 3 μm through an array formation process. Also, a combination of a circular polarizing plate or a linear polarizing plate and a phase-retarder layer requires a large thickness for organic light emitting displays of related art. However, in the present invention, the polarizer for preventing exterior light can be omitted. Also, flexibility and thinness of organic light emitting displays can thus be easily realized. Generally polarizing plates have a thickness of about 150 μm or more, but this thickness can be reduced and great effects of improvement in transmittance and reduction in thickness can thus be obtained.

Second, the black matrix layer and the color filter layer can be readily formed through a printing process only, without using any mask.

Third, the black matrix layer can be easily formed, further can absorb colors of light according to individual wavelength bands and thus prevents reflection and recognition of exterior light incident upon the organic light emitting display by existing the electrode in the organic light emitting diode. As compared to a structure using a polarizing plate, the structure according to the present invention has similar reflectivity and improved transmittance of a device and thus improved optical efficiency.

Fourth, in a case in which the circular polarizing plate or the like is provided, an organic film requiring light-isotropy is used as the etch stopper layer in order to compensate a viewing angle. The present invention does not require this organic film, thus enabling use of a general organic film incapable of performing optical compensation. Accordingly, an expensive optical film can be omitted and the cost can thus be reduced.

Fifth, the black matrix layer and the color filter layer used for the exterior light shielding layer can alternate interlayer insulating films, thus enabling formation of a touch electrode array without increase in thickness and addition of separate processes.

Sixth, the organic light emitting display of the present invention is of an in-cell type in which the touch electrode array is included in the cover glass, thus requiring no separate process for attaching a touchscreen thereto and thus enabling realization of slim displays fabricated through a simple process.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display comprising:
    a film substrate;
    a first buffer layer on the film substrate;
    a thin film transistor in each of a plurality of pixels on the first buffer layer;
    an organic light emitting diode connected to a thin film transistor of each pixel;
    a protective layer on the organic light emitting diode and the thin film transistor;
    an adhesive layer on the protective layer;
    first and second touch electrodes and an exterior light shielding layer on the adhesive layer;
    a second buffer layer on the touch electrodes and the exterior light shielding layer; and
    a cover glass on the second buffer layer, wherein at least one of the first and second touch electrodes, and the exterior light shielding layer is in direct contact with the adhesive layer and adhered to the protective layer via the adhesive layer.

2. The organic light emitting display according to claim 1, wherein the exterior light shielding layer further comprises at least of a color filter layer and a black maxtrix layer.

3. The organic light emitting display according to claim 1, wherein the exterior light shielding layer is disposed on the first touch electrode.

4. The organic light emitting display according to claim 1, wherein the first and second touch electrodes are disposed on the exterior light shielding layer.

5. The organic light emitting display according to claim 2, wherein the black matrix layer and the color filter layer are disposed in the same layer.

6. The organic light emitting display according to claim 2, wherein the black matrix layer and the color filter layer are disposed in different layers.

7. The organic light emitting display according to claim 1, wherein the first buffer layer and the second buffer layer have a laminate structure comprising a plurality of inorganic films.

8. The organic light emitting display according to claim 1, further comprising a first etch stopper film between the rear surface of the first buffer layer and the film substrate and, a second etch stopper film between the rear surface of the second buffer layer and the cover glass.

9. The organic light emitting display according to claim 8, wherein the first etch stopper film and the second etch stopper film comprise one of polyimide or photoacryl.

10. The organic light emitting display according to claim 1, wherein the organic light emitting diode comprises a bank comprising a black matrix corresponding to the edge of each pixel.

11. The organic light emitting display according to claim 2, wherein the first touch electrode is disposed in a first direction and comprises a plurality of first electrode patterns, each having an island shape and a metal bridge to electrically connect adjacent first electrode patterns, and
    the second touch electrode is disposed in a direction intersecting the first direction, and comprises a plurality of second electrode patterns, each having the same shape as each of the first electrode patterns and a connection pattern to connect adjacent second electrode patterns, integrated with the second electrode patterns.

12. The organic light emitting display according to claim 11, wherein the plurality of first electrode patterns, the plurality of second electrode patterns and the connection patterns are formed as the same transparent electrode in a first layer,
    the metal bridge is formed in a second layer on a first interlayer insulating film interposed between the first layer and the second layer, and
    the first interlayer insulating film comprises a contact hole formed in a region where the metal bridge overlaps the adjacent first electrode patterns.

13. The organic light emitting display according to claim 12, further comprising: a second interlayer insulating film on the first interlayer insulating film including the plurality of first and second electrode pattern, and a common transparent electrode pattern covering the second interlayer insulating film, the plurality of first and second electrode patterns and the connection pattern.

14. The organic light emitting display according to claim 12, wherein both of the black matrix layer and the color filter layer comprise the first interlayer insulating films or the second interlayer insulating films.

15. The organic light emitting display according to claim 12, wherein one of the black matrix layer and the color filter layer is comprised in the first interlayer insulating film and the other is comprised in the second interlayer insulating film.

16. The organic light emitting display according to claim 12, wherein the black matrix layer and the color filter layer are disposed under the metal bridge.

17. The organic light emitting display according to claim 13, wherein the black matrix layer and the color filter layer are on the common transparent electrode pattern.

18. The organic light emitting display according to claim 1, wherein the organic light emitting diode comprises:
    first and second electrodes facing each other; and
    a light emitting layer between layers of the first and second electrodes.

19. The organic light emitting display according to claim 18, wherein the color filter layer of each pixel comprises a color filter that transmits light having the same color as light emitted from the light emitting layer in each pixel.

* * * * *